United States Patent
Wang et al.

(10) Patent No.: US 7,989,247 B2
(45) Date of Patent: Aug. 2, 2011

(54) IN-PLANE SENSOR AND METHOD FOR MAKING SAME

(75) Inventors: Chuan Wei Wang, HsinChu (TW); Sheng Ta Lee, HsinChu (TW)

(73) Assignee: PixArt Imaging Incorporation, Hsin-Chu (TW)

( * ) Notice: Subject to any disclaimer, the term of this patent is extended or adjusted under 35 U.S.C. 154(b) by 571 days.

(21) Appl. No.: 12/220,847

(22) Filed: Jul. 29, 2008

(65) Prior Publication Data
US 2009/0277267 A1    Nov. 12, 2009

(30) Foreign Application Priority Data
May 9, 2008    (TW) .............................. 97117135 A

(51) Int. Cl.
*H01L 21/00* (2006.01)
*G01P 15/125* (2006.01)

(52) U.S. Cl. ...................................... 438/50; 73/514.32
(58) Field of Classification Search ............... 73/514.32; 438/48, 50
See application file for complete search history.

(56) References Cited

U.S. PATENT DOCUMENTS

| | | | | |
|---|---|---|---|---|
| 6,030,850 A | * | 2/2000 | Kurle et al. | 438/48 |
| 6,712,983 B2 | * | 3/2004 | Zhao et al. | 216/2 |
| 7,666,702 B2 | * | 2/2010 | Li et al. | 438/52 |

* cited by examiner

*Primary Examiner* — John Chapman, Jr.
(74) *Attorney, Agent, or Firm* — Tung & Associates

(57) ABSTRACT

According to the present invention, an in-plane sensor comprises: a fixed structure including a fixed finger and a fixed column connected to each other, the fixed finger having a supported end supported by the fixed column and a suspended end which is unsupported; and a movable structure including at least one mass body and an extending finger connected to each other; wherein the supported end of the fixed finger is closer to the mass body than the suspended end is.

10 Claims, 13 Drawing Sheets

400

IN-PLANE SENSOR AND METHOD FOR MAKING SAME

BACKGROUND

1. Field of Invention

The present invention relates to an in-plane sensor and a method for making the in-plane sensor, in particular to an in-plane sensor and a method for making the in-plane sensor which are able to reduce the impact of the residual stress in the manufacturing process to the sensor.

2. Description of Related Art

An in-plane sensor senses the capacitance variation resulting from a change of the distance between two electrodes, and generates a corresponding signal. Such in-plane sensor may be used in, e.g., an accelerometer or a gyro sensor. Related art can be found in, e.g., U.S. Pat. Nos. 5,326,726; 5,847,280; 5,880,369; 6,877,374; and 6,892,576.

All of the above cited prior art include the same drawback, as described below. Referring to FIG. 1, such micro-electro-mechanical device typically includes one or more fixed structures 50 and one movable structure 60. The fixed structure 50 includes multiple fixed fingers 52 which are suspended but fixed to fixed columns 58. The fixed fingers 52 are interconnected with each other by the fixed columns 58 and connection parts 56. The fixed columns 58 are fixed to an underlying substrate (not shown). The movable structure 60 includes a proof mass body 62, extending fingers 64, connection parts 66 and anchors 68. The movable structure 60 (including the proof mass body 62, the extending fingers 64, and the connection parts 66) is suspended except the anchor 68 which is also fixed to the underlying substrate. When the overall device moves, the movement causes a change in the distance between the suspended portion of the movable structure 60 and the fixed structure 50, i.e., the distance between the fixed fingers 52 and the extending fingers 64 changes. As the fixed fingers 52 and the extending fingers 64 are the two electrodes of a capacitor, the capacitance of the capacitor correspondingly changes. Thus, by measuring the capacitance, the direction, speed and acceleration of the movement of the overall device can be calculated. These data can provide important information in the field applied to by the micro-electro-mechanical device.

Referring to FIG. 2 which is a cross-sectional view taken along the X-X section of FIG. 1, because both the fixed finger 52 and the extending finger 64 are suspended, they are very easily warped during semiconductor manufacturing process. In this case the overlapping area between the fixed finger 52 and the extending finger 64 significantly decreases, reducing the effective capacitance between them. Hence, it is desired to improve the structure of such micro-electro-mechanical device so that it is less impacted by the process.

SUMMARY

In view of the foregoing drawback, it is a first objective of the present invention to provide an in-plane sensor with reduced impact of the residual stress in the manufacturing process to the sensor.

It is a second objective of the present invention to provide a method for making an in-plane sensor.

In accordance with the foregoing and other objectives of the present invention, and from one aspect of the present invention, an in-plane sensor comprises: a fixed structure including a fixed finger and a fixed column connected to each other, the fixed finger having a supported end supported by the fixed column and a suspended end which is unsupported; and a movable structure including at least one mass body and an extending finger connected to each other; wherein the supported end of the fixed finger is closer to the mass body than the suspended end is.

From another aspect of the present invention, an in-plane sensor comprises: a fixed structure including a fixed finger and a fixed column connected to each other, the fixed finger having a supported end supported by the fixed column and a suspended end which is unsupported; and a movable structure including a mass body and an extending mass connected to each other by an extending finger.

In the above-mentioned in-plane sensors, preferably, the continuous length of the mass body in any of x and y directions is less than a predetermined upper limit, e.g., 60 μm-100 μm.

Also preferably, the movable structure in the above-mentioned in-plane sensors further includes a spring which has at least a curve in its longer dimension.

From yet another aspect of the present invention, a method for making an in-plane sensor is provided, the in-plane sensor comprising a fixed structure including a fixed finger and a fixed column connected to each other, and a movable structure including at least one mass body and an extending finger connected to each other, the method comprising: providing a substrate on which at least a contact layer and at least a metal layer have been deposited to form the fixed column of the fixed structure, the fixed column being surrounded by a first material region; depositing and defining at least a metal layer and a via layer to form the fixed finger of the fixed structure and the mass body and the extending finger of the movable structure, the fixed finger of the fixed structure, and the mass body and the extending finger of the movable structure are surrounded by a second material region; and removing the first and second material regions.

In the above-mentioned method, the first and second material regions can be removed in one step or in two or more steps.

Preferably, the step of removing the first and second material regions includes: depositing a protection layer; depositing a hard mask; patterning the protection layer and the hard mask; and etching the first and second material regions. More preferably, after patterning the protection layer and the hard mask, a mask is deposited.

It is to be understood that both the foregoing general description and the following detailed description are provided as examples, for illustration and not for limiting the scope of the invention.

BRIEF DESCRIPTION OF THE DRAWINGS

These and other features, aspects, and advantages of the present invention will become better understood with regard to the following description, appended claims, and accompanying drawings where:

FIGS. 7A-7H show a process embodiment according to the present invention, wherein
FIGS. 7A, 7C and 7E-7G are cross-sectional views taken along the A-A section of FIG. 3, and FIGS. 7B, 7D and 7H are cross-sectional views taken along the B-B section of FIG. 3.

DESCRIPTION OF THE PREFERRED EMBODIMENTS

The drawings as referred to throughout the description of the present invention are for illustration only, but not drawn according to actual scale.

Figure 1:
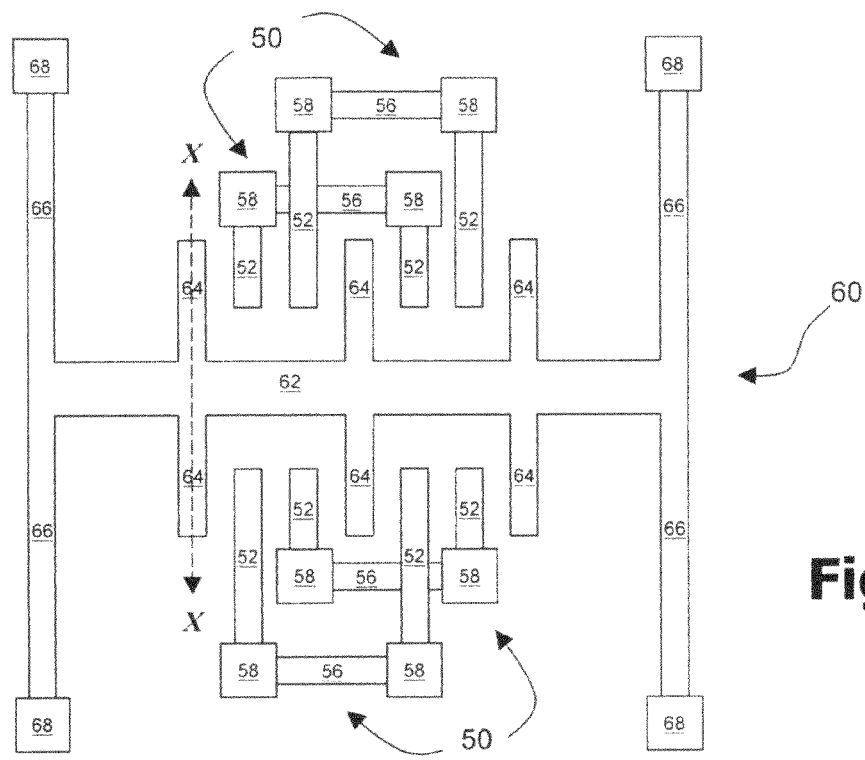
FIG. 1 shows a conventional in-plane sensor.
Figure 2:
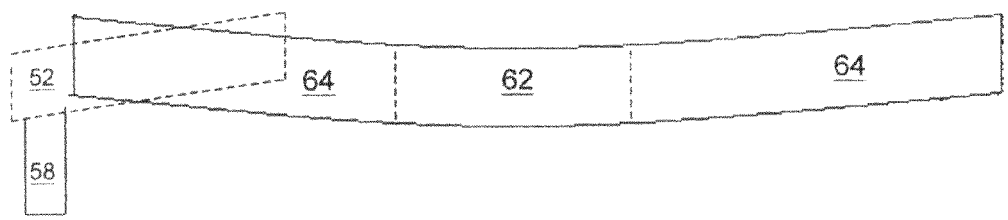
FIG. 2 shows the drawback in the prior art.
Figure 3:
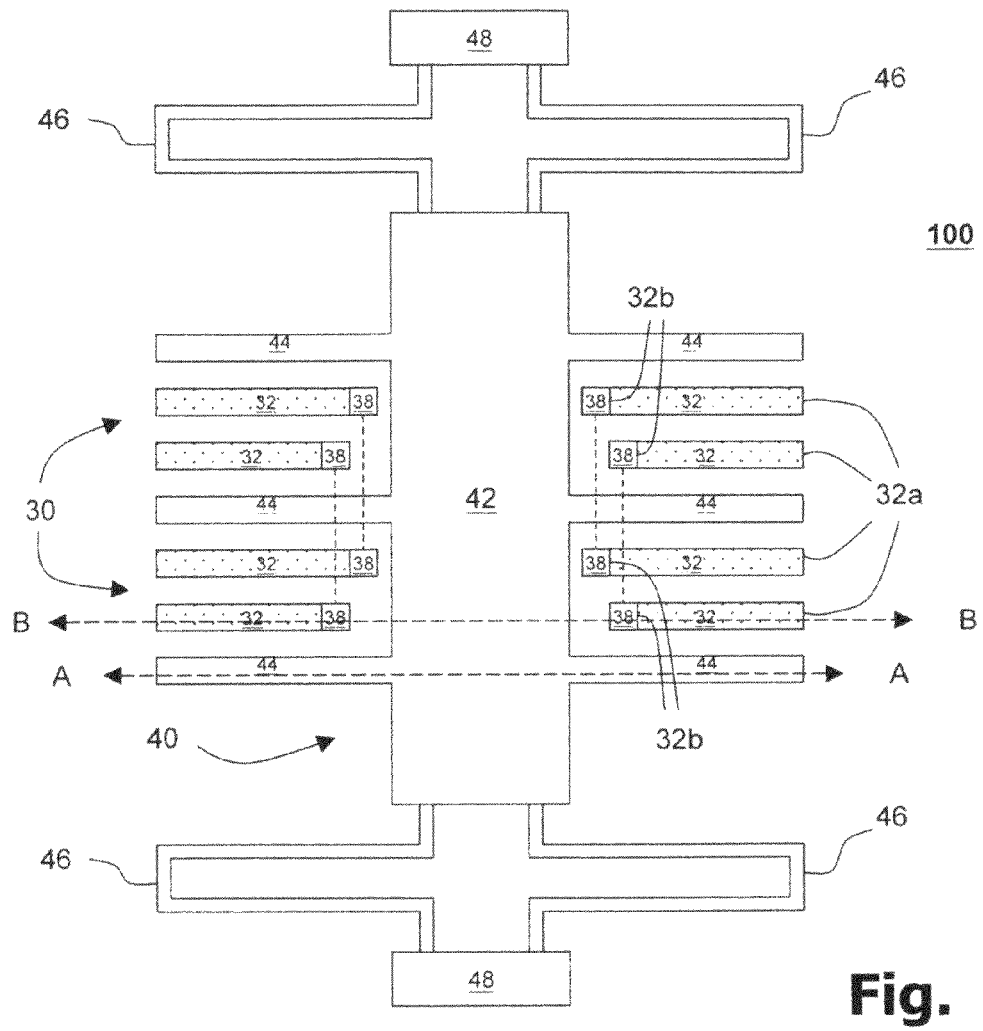
FIG. 3 shows an embodiment of the present invention.
Figure 4:
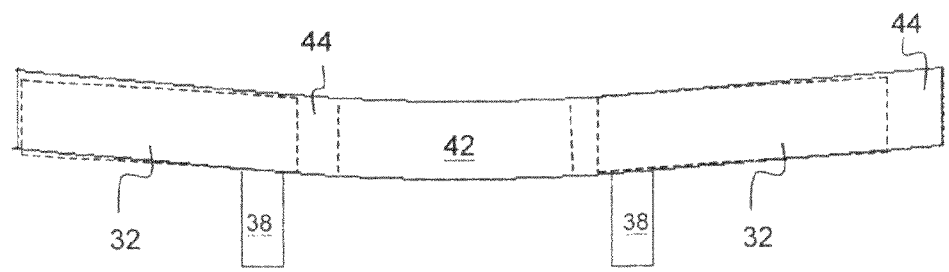
FIG. 4 shows that the drawback in the prior art is overcome by the present invention.

Referring to FIG. 3, in one embodiment of the present invention, an in-plane sensor has a micro-electro-mechanical structure 100 which includes at least a fixed structure 30 and a movable structure 40. The movable structure 40 includes a mass body 42, extending fingers 44, connection parts 46 and anchors 68, connected together. The mass body 42, extending fingers 44 and connection parts 46 are suspended, while the anchors 68 are fixed to an underlying substrate. In one embodiment, the connection parts 46 are springs. The fixed structure 30 includes multiple fixed fingers 32 which are suspended; each fixed finger 32 has a suspended end 32a and a supported end 32b, the latter being fixed to a fixed column 38. The fixed columns 38 are electrically connected with one another by the substrate or overlying interconnection (the electrical connection is shown by the dot lines). One feature of the present invention is that the supported end 32b is closer to the mass body 42 than the suspended end 32a is; the supported end 32b is at the same side as the mass body 42, while the suspended end 32a is at the other side. Thus, as shown in FIG. 4, even if the manufacturing process causes wafer bending, since the suspended end 32a of the fixed finger 32 is located at the same side as the outer edge of the extending finger 44, the bending effect on the fixed finger 32 and the extending finger 44 is similar so that they still overlap in a large area, and keep a high capacitance.

Figure 5A:
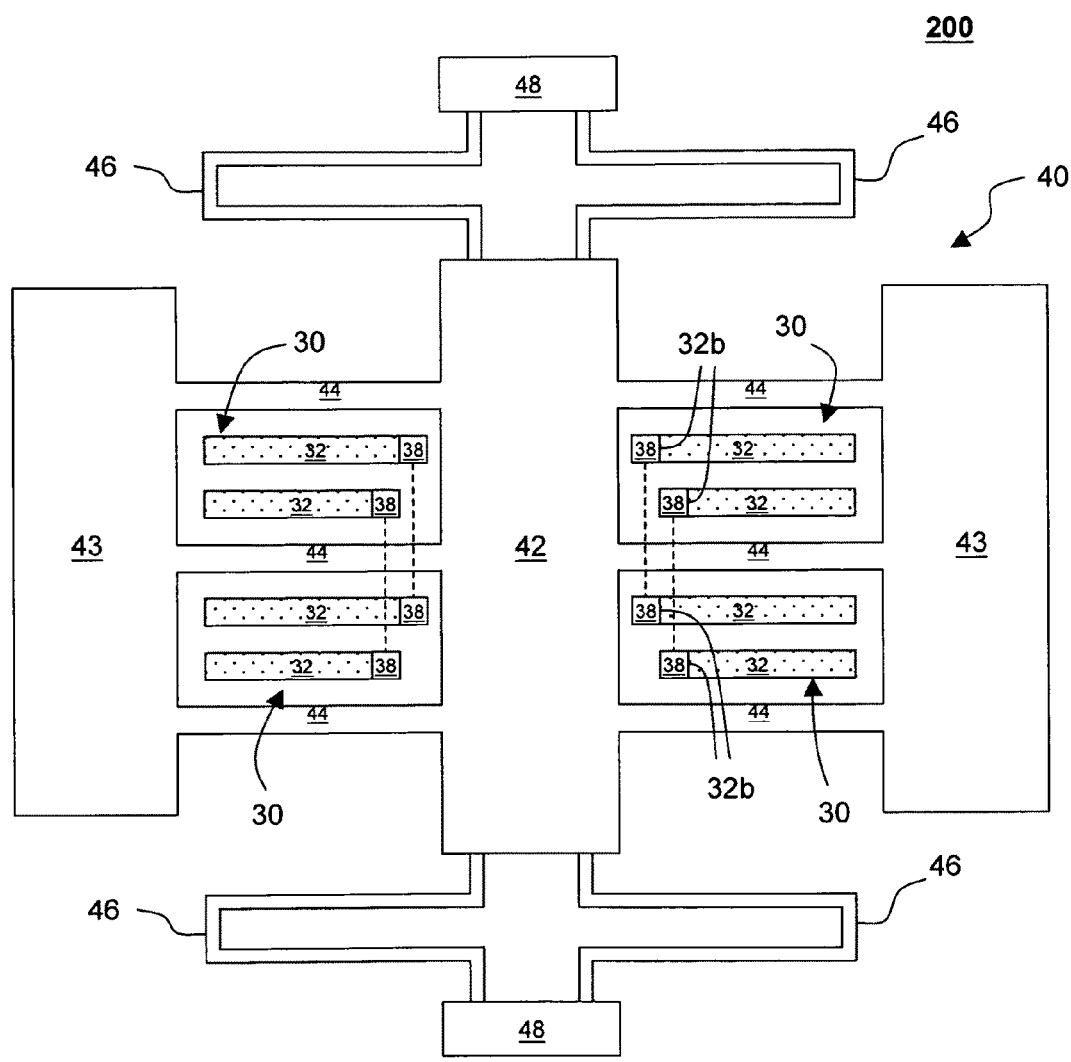
FIGS. 5A and 5B show two embodiments of the present invention.

FIG. 5A shows another embodiment of the present invention. The micro-electro-mechanical structure 200 in this embodiment also includes at least a fixed structure 30 and a movable structure 40. This embodiment is characterized in that, except the mass body 42, the extending fingers 44, the connection parts 46 and the anchors 48, the movable structure 40 further includes at least one extending mass 43. Due to the extending mass 43, the extending fingers 44 are connected with large masses at their both sides. In this embodiment, the suspended end 32a of the fixed finger 32 may be located at the same side as the mass body 42 (as shown), or located at the same side as the extending mass 43 (not shown). The rest of the structure is similar to that in the previous embodiment.

Figure 5B:
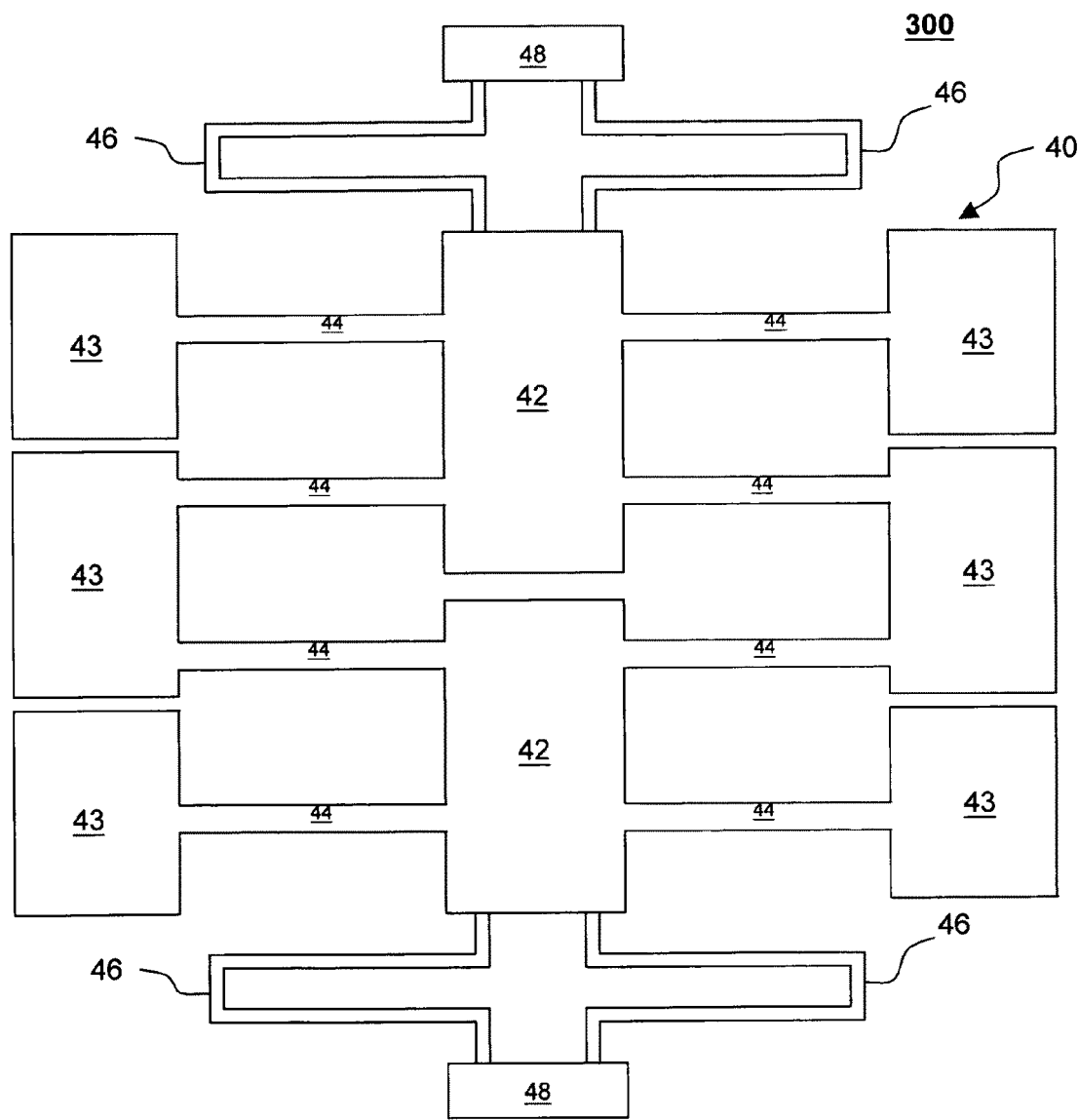

FIG. 5B shows another embodiment of the present invention, in which the fixed structure 30 is omitted. The micro-electro-mechanical structure 300 of this embodiment includes extending masses 43, and furthermore both the mass body 42 and the extending masses 43 are longitudinally (y-direction in the figure) divided into several segments connected together. The purpose for such division is to reduce the continuous length of the mass body 42 and the extending masses 43 in the y-direction to reduce bending. The continuous length may be kept under a predetermined length limit such as 60 μm-100 μm.

Figure 6A:
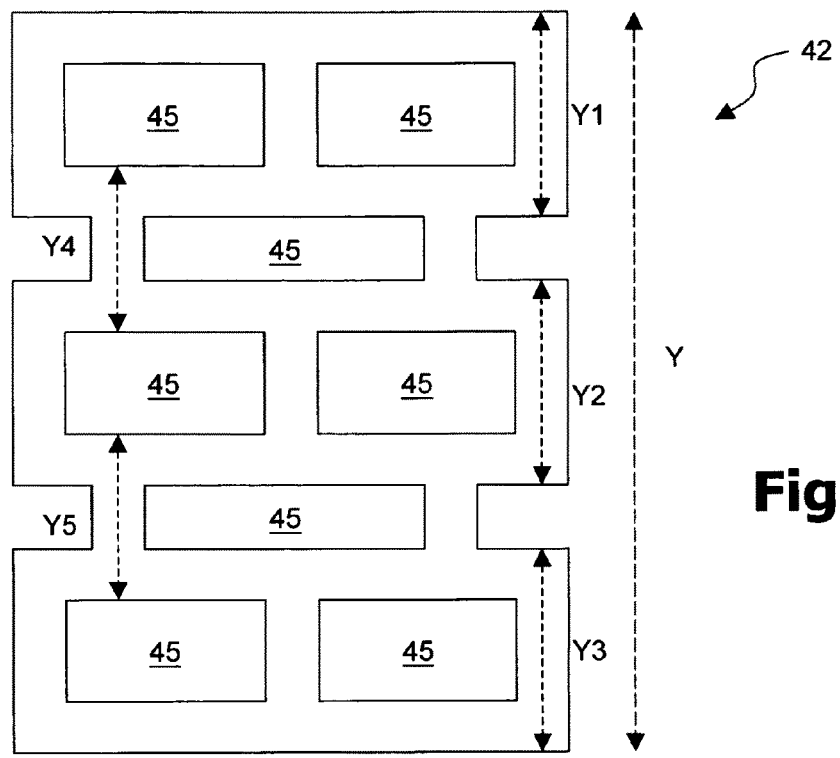
FIGS. 6A-6C show three embodiments of the present invention.
Figure 6B:
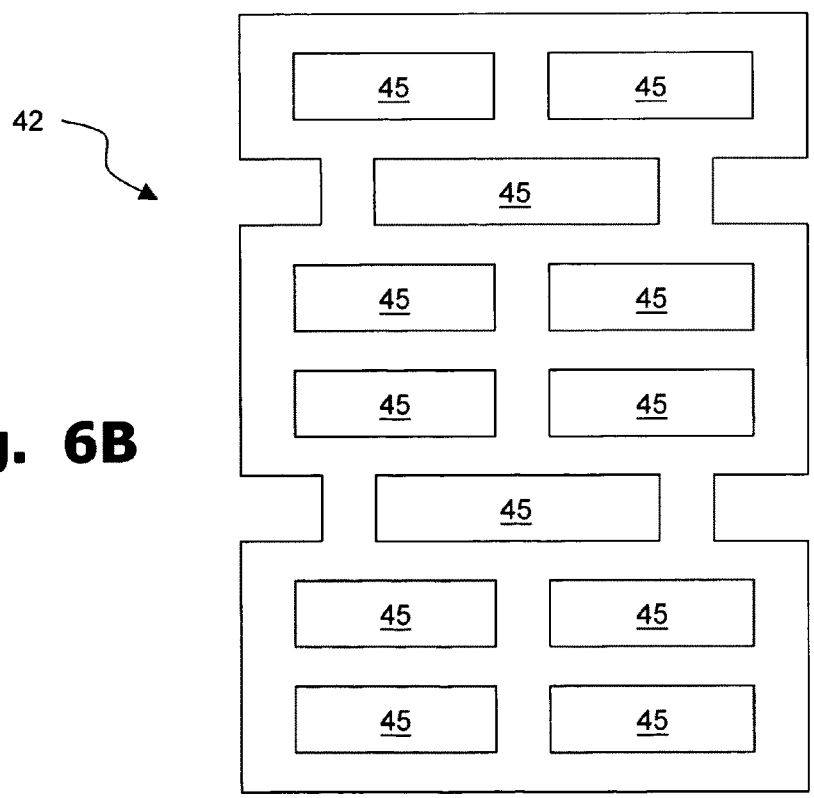

FIG. 6A shows a further embodiment of the present invention in which only the mass body 42 is shown. In this embodiment, the mass body 42 includes a plurality of large openings 45. This provides two effects: first, it is easier to etch the material under the mass body 42; second, the continuous length of the mass body 42 in either x or y or both directions (only y-direction in this embodiment) will not be too long. More specifically, as shown in FIG. 6A, the mass body 42 is divided into several segments Y1, Y2 . . . in its y-direction, and each segment has a longitudinal length under a predetermined limit such as 60 μm-100 μm. The purpose for this arrangement is to reduce bending; because the continuous length in a direction is limited, the bending situation in that direction can be reduced. There are numerous ways to arrange the locations, sizes, etc. of the openings in addition to that shown in FIG. 6A; FIG. 6B shows another example. In the embodiments shown in FIGS. 6A and 6B, only the length in y-direction is limited, but the same arrangement can be applied to the x-direction or any other direction. Moreover, the openings can be arranged also on the extending masses 43.

Figure 6C:
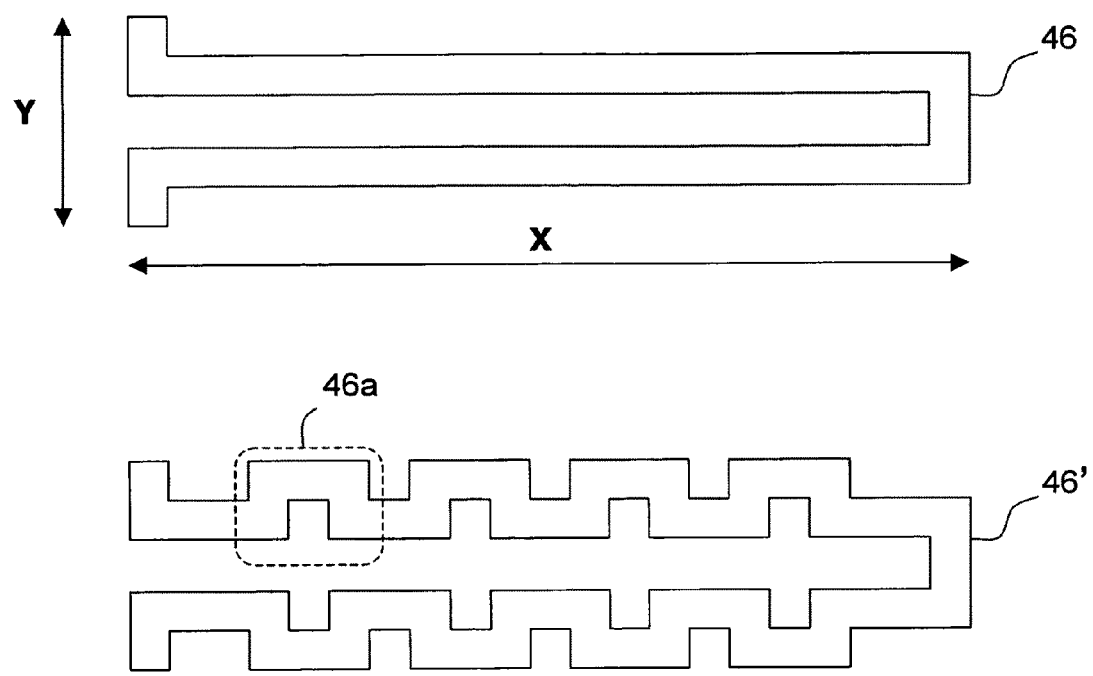

The structure of the spring 46 is not limited to that shown in the embodiments of FIGS. 3, 5A and 5B. Referring to FIG. 6C which shows a simple spring 46 (only the right side) of FIGS. 3, 5A and 5B in comparison with a relatively more sophisticated spring 46', the spring 46' has at least one curve 46a in its longer dimension (x-direction in this case) to increase its effective length. This reduces the elastic modulus of the spring and increases the sensitivity of the sensor.

Figure 7A:
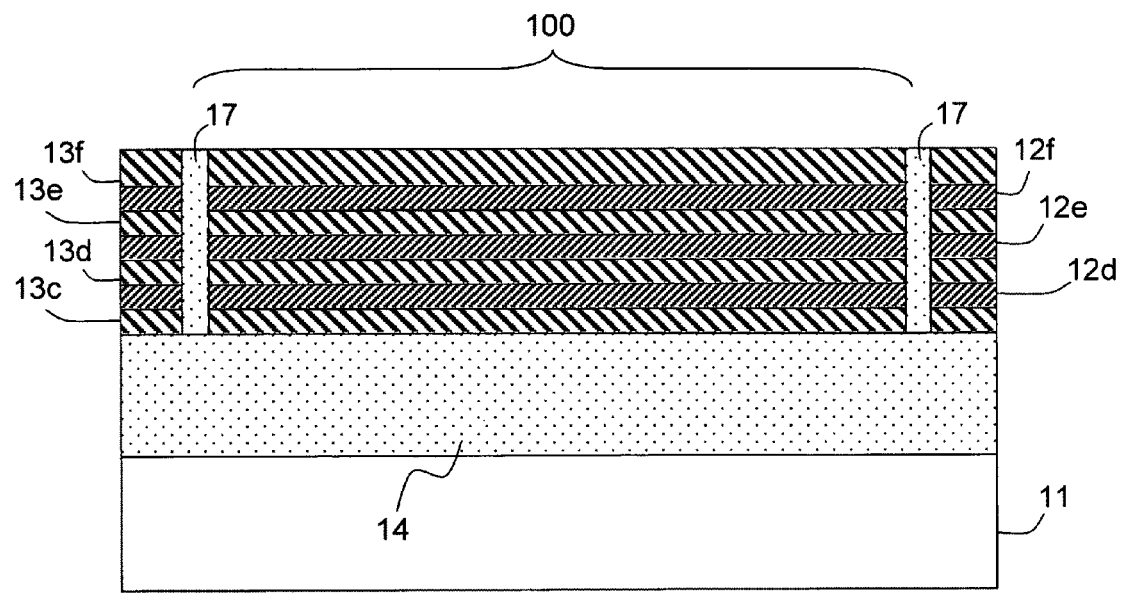
Figure 7B:
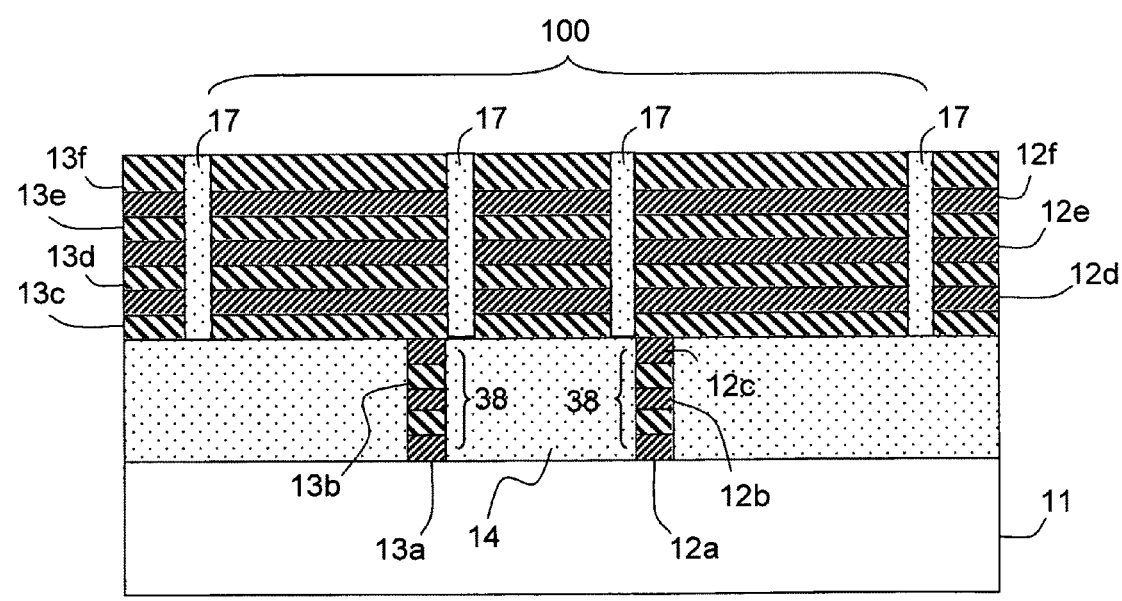

Hereinafter a process embodiment for making the in-plane sensor will be described with reference to FIGS. 7A-7H, taking the structure of FIG. 3 as an example. A six-metal-layer process is shown as an example, but the present invention can certainly be embodied in a process of any other number of metal layers, for making the structures of FIGS. 5A, 5B, 6A, 6B and other structures under the spirit of the present invention. Referring to FIG. 7A which is a cross-sectional view taken along the A-A section of FIG. 3 and FIG. 7B which is a cross-sectional view taken along the B-B section of FIG. 3, in this embodiment, a zero-layer wafer substrate 11 is provided, which for example can be a silicon wafer so that the process is compatible with a standard CMOS process. Next, transistor devices can be formed by standard CMOS process steps as required (not shown), followed by deposition, lithography and etch steps to form interconnection including a contact layer 12a, a first metal layer 13a, a first via layer 12b, a second metal layer 13b, and a second via layer 12c, and concurrently form the fixed column 38 of FIG. 3, as shown in FIG. 7B. The lower structure shown in the figure includes two metal layers in which, for example, the contact layer and the via layers can be made of tungsten with a pre-deposited poly-silicon or nitride layer; the metal layers can be made of aluminum; and the dielectric layer can be made of oxides such as silicon oxide. Other conductive or dielectric materials can be used to replace what are suggested above, and the lower structure can include more or less number of metal layers. The pattern of each of the layers 12a-12c and 13a-13b is thus that an oxide region 14 (the first material region to be etched) is formed. The area outside the micro-electro-mechanical structure 100 is not shown for simplicity of the drawings. The oxide region 14 may be made of silicon oxide, for example. In order that the etching of the oxide region 14 does not damage the other areas in the micro-electro-mechanical device, preferably, the oxide region 14 is encompassed in a guard ring (not shown). The guard ring can be formed concurrently with the patterns of the layers 12a-12c and 13a-13b.

And next, an interconnection structure is formed on the substrate, which includes via layers 12d-12f and metal layers 13c-13f. According to the design of the micro-electro-mechanical device, some areas have to be isolated from one another; in this embodiment, they are isolated from one another by an oxide region 17. The oxide region 17 can be formed concurrently with the patterns of the via layers 12d-12f and metal layers 13c-13f.

Figure 7C:
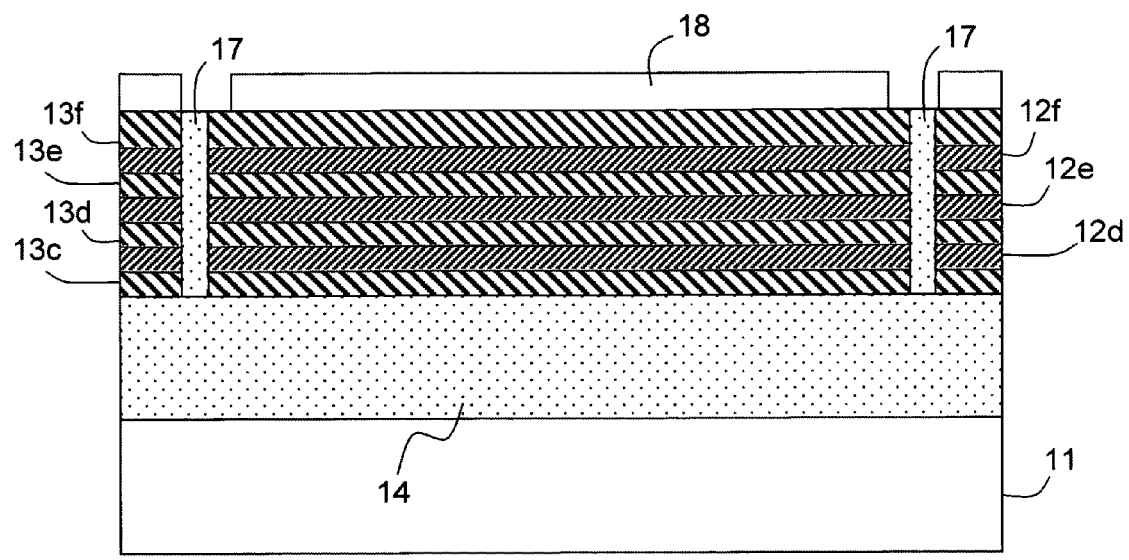
Figure 7D:
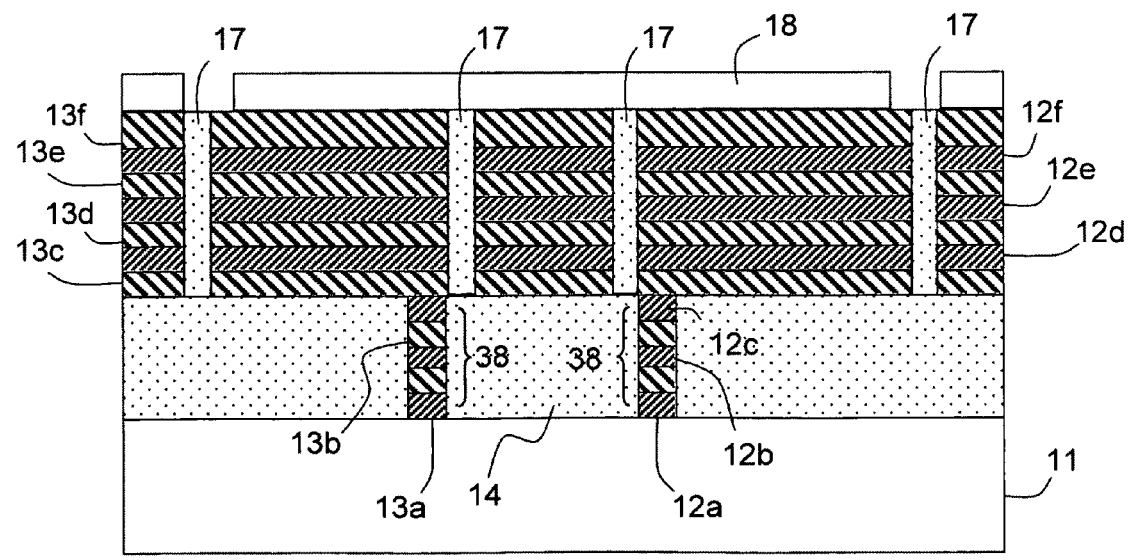

Referring to FIGS. 7C and 7D which follow FIGS. 7A and 7B, in one embodiment, a mask 18 is formed and patterned to expose the oxide region 17 (the second material region to be etched). The mask 18 for example can be a photoresist layer patterned by lithography, or other materials such as a metal layer or an amorphous silicon layer. The embodiment using the metal layer or the amorphous silicon layer as the mask will be described later.

Figure 7E:
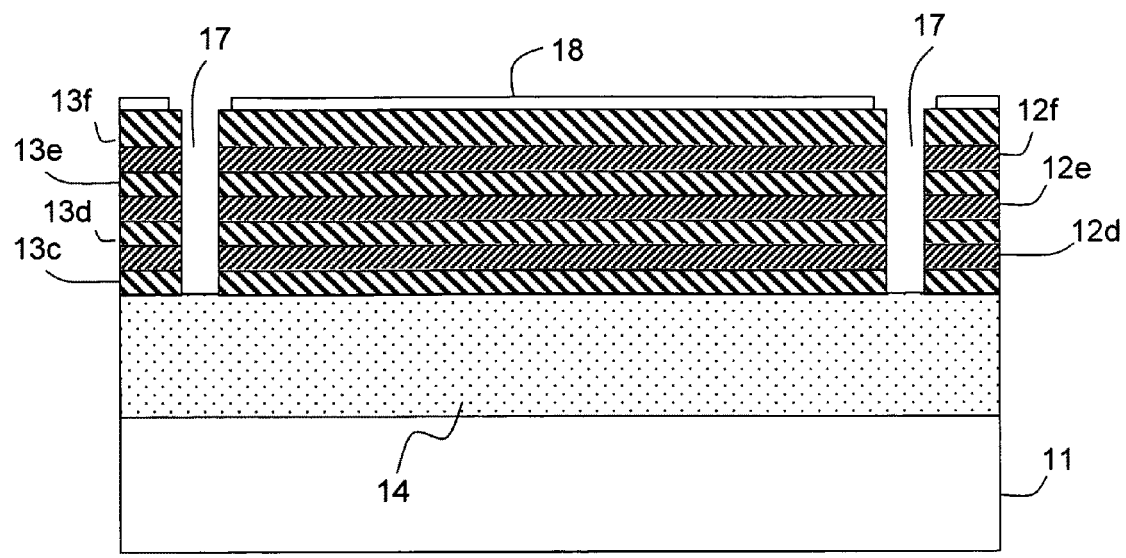

Referring to FIG. 7E which follows FIG. 7C, an oxide etch step is performed according to the pattern of the mask 18, to remove the oxide inside the oxide region 17. The etch for example can be anisotropic RIE (reactive ion etch). The etch step consumes most of the mask 18 in this embodiment.

Note that the steps from FIGS. 7C to 7E are optional and can be omitted; that is, the process can proceed directly after FIGS. 7A and 7B to FIG. 7F.

Figure 7F:
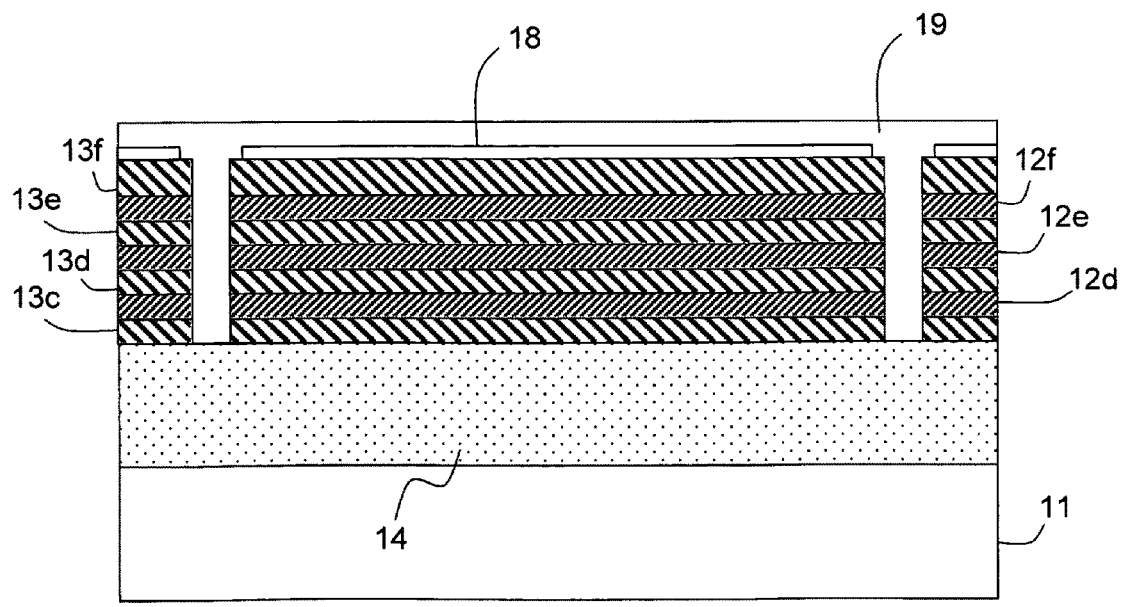

Next referring to FIG. 7F, regardless whether the mask 18 is consumed, a mask 19 is formed which for example is a photoresist layer, and an etch step is performed on the oxide region 14 to remove it. The etch for example can be HF vapor etch, or BOE (buffered oxide etch) by immersing the whole wafer in an acid tank.

Figure 7G:
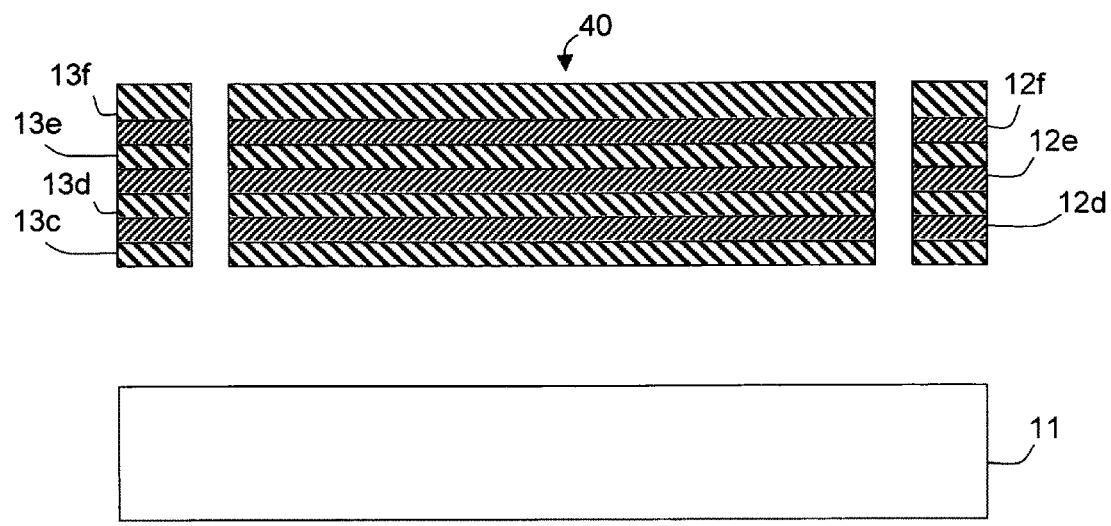
Figure 7H:
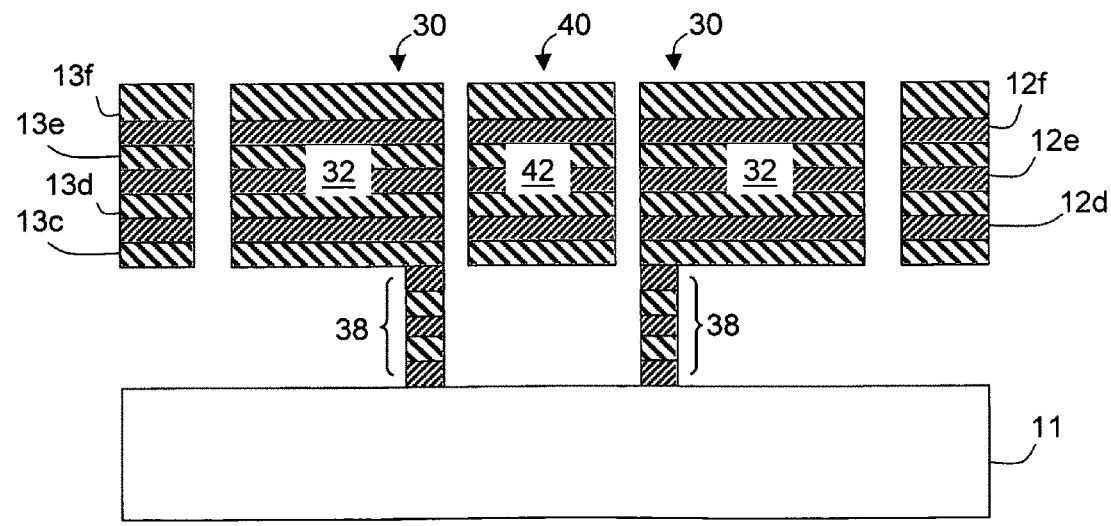

Finally, as shown in FIG. 7G, the photoresist layers 18 and 19 are removed to obtain the desired micro-electro-mechanical device. This cross sectional view only shows the movable structure 40. FIG. 7H is a cross-sectional view taken along the B-B section of FIG. 3, which shows the fixed structure 30 (including the fixed fingers 32 and the fixed columns 38) and a part of the movable structure 40 (the mass body 42).

Figure 8A:
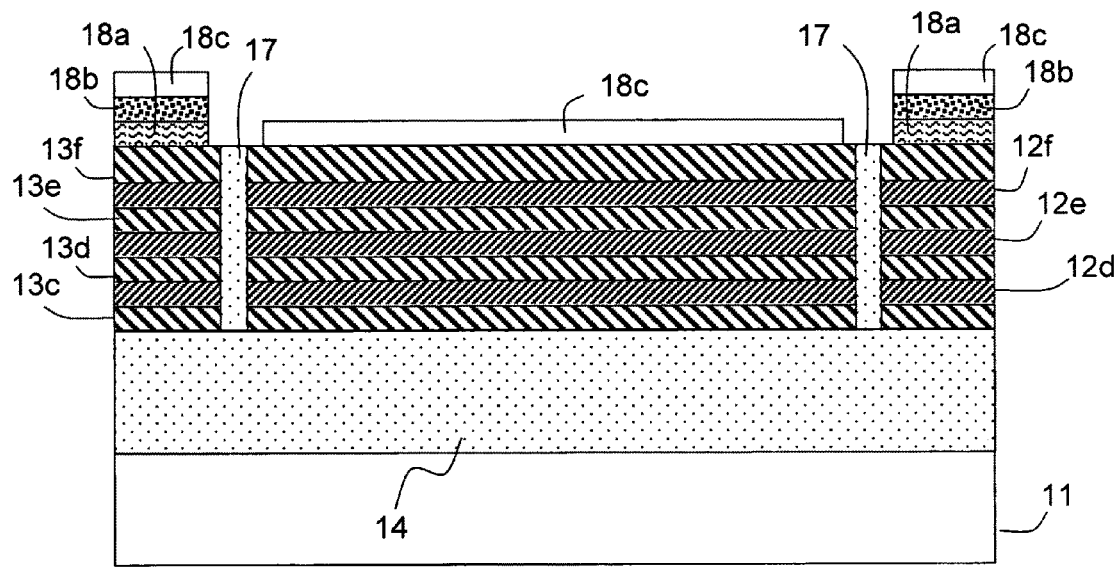
FIGS. 8A-8C and FIGS. 9A-9C show two process embodiments according to the present invention.
Figure 9A:
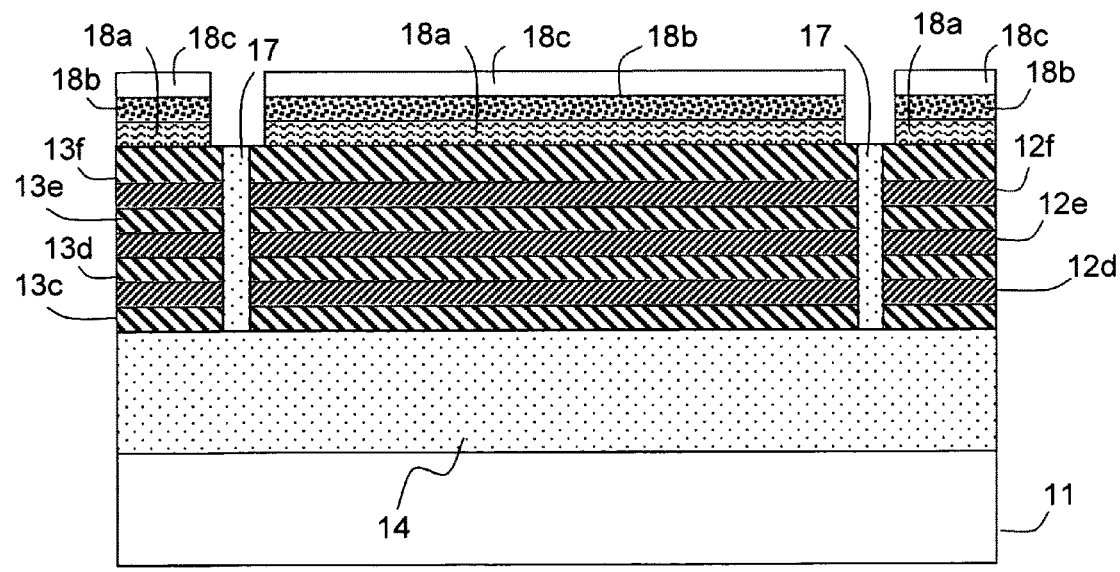

FIG. 8A follows FIG. 7A, which shows an embodiment using the metal layer or the amorphous silicon layer as the mask. In this embodiment, preferably, a protection layer 18a is deposited on the uppermost metal layer 13f. The protection layer 18a for example can be an oxide layer or a bi-layer structure including an oxide layer and a nitride layer. A hard mask layer 18b is deposited on the protection layer 18a; the hard mask layer 18b for example can be a metal layer or an amorphous silicon layer. In the embodiment shown in the figure, the protection layer 18a and the hard mask layer 18b have been patterned to open the micro-electro-mechanical structure 100. Because a hard mask layer 18b is provided, the photoresist layer 18c in the figure is not necessarily required and can be omitted. In this embodiment, two patterning steps are required (to pattern the protection layer 18a and the hard mask layer 18b, and to pattern the photoresist layer 18c). However this is not the only way to embody the present invention; the layers can be patterned by one step, as shown in FIG. 9A.

Figure 8B:
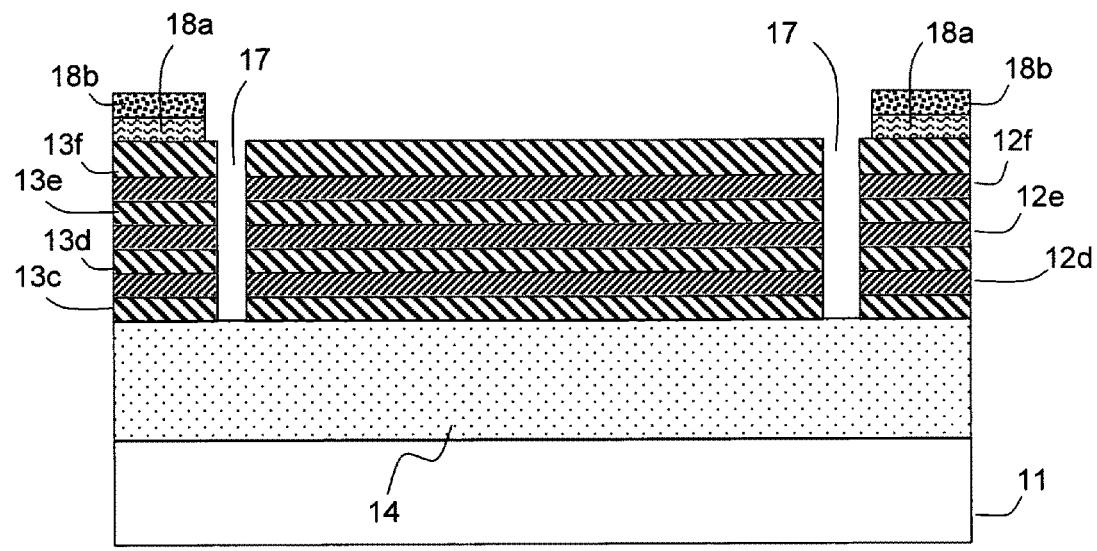
Figure 9B:
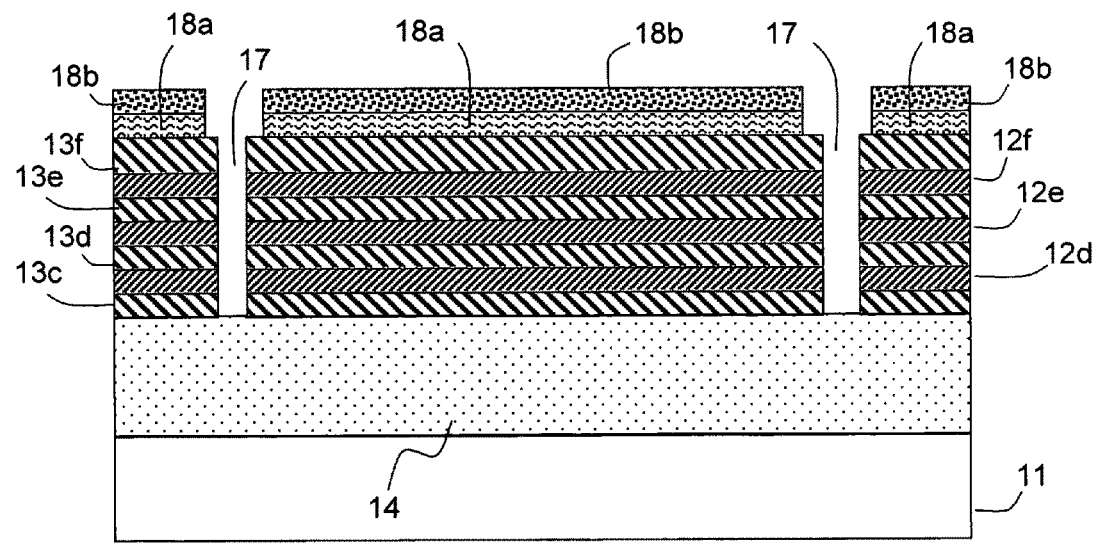

Next, referring to FIGS. 8B and 9B, an oxide etch step is performed to remove the oxide inside the oxide region 17. The etch for example can be anisotropic RIE (reactive ion etch) The etch step consumes most of the photoresist layer 18c, but the hard mask 18b still exist. Likely, this etch step is optional and can be omitted; the process can proceed directly to FIGS. 8C and 9C.

Figure 8C:
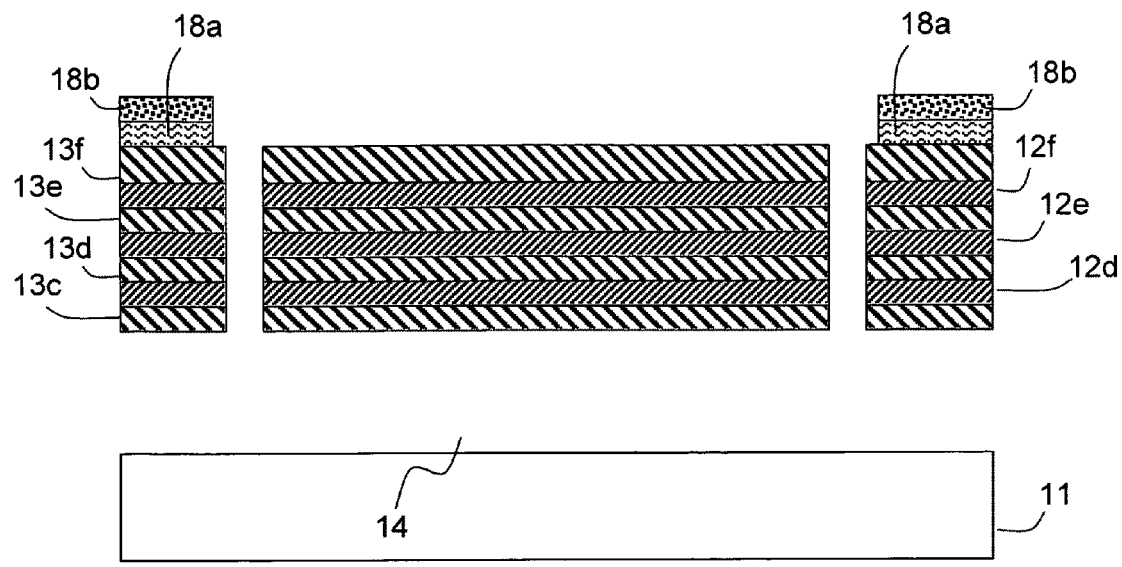
Figure 9C:
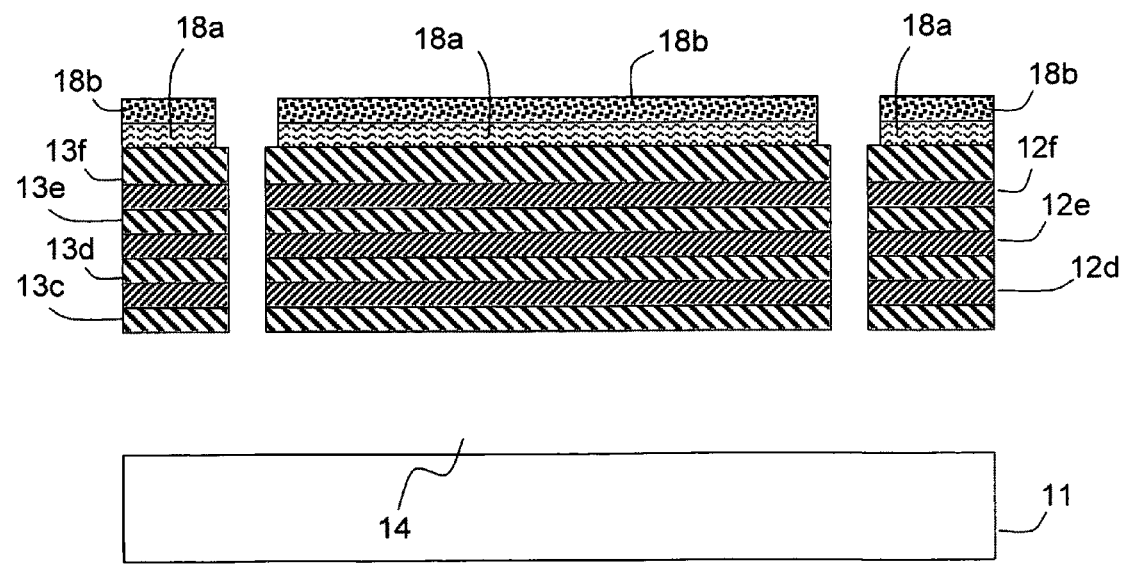

Next, referring to FIGS. 8C and 9C, an oxide etch step is performed on the oxide region 14 to remove it. The etch for example can be HF vapor etch, or BOE (buffered oxide etch) by immersing the whole wafer in an acid tank. Thus, the desired micro-electro-mechanical device is obtained. The difference between FIGS. 8C and 9C is in that there are the protection layer 18a and the hard mask layer 18b residual on the micro-electro-mechanical structure area 100 in FIG. 9C. These layers, together with the hard mask 18b outside the area 100, can be removed by an etch process if necessary.

The above process can be applied to making the structures shown in FIGS. 5A, 5B, 6A and 6B.

Although the present invention has been described in detail with reference to certain preferred embodiments thereof, the description is for illustrative purpose and not for limiting the scope of the invention. For example, the openings in FIGS. 6A and 6B can be arranged in many other ways. The spring can be of any structure other than those shown in FIG. 6C. The metal layer can be made of copper instead of aluminum, and the dielectric layer can be made of a low dielectric constant material instead of silicon oxide. One skilled in this art can readily think of other modifications and variations in light of the teaching by the present invention. In view of the foregoing, it is intended that the present invention cover all such modifications and variations, which should interpreted to fall within the scope of the following claims and their equivalents.

What is claimed is:

1. A method for making an in-plane sensor, the in-plane sensor comprising a fixed structure including a fixed finger and a fixed column connected to each other, and a movable structure including at least one mass body and an extending finger connected to each other, the method comprising:
   providing a substrate on which at least a contact layer and at least a metal layer have been deposited to form the fixed column of the fixed structure, the fixed column being surrounded by a first material region;
   depositing and defining at least a metal layer and a via layer to form the fixed finger of the fixed structure and the mass body and the extending finger of the movable structure, the fixed finger of the fixed structure, and the mass body and the extending finger of the movable structure are surrounded by a second material region; and
   removing the first and second material regions.

2. The method of claim 1, wherein the first and second material regions are made of an oxide.

3. The method of claim 1, wherein the step of removing the first and second material regions includes: removing the first and second material regions by HF vapor etch or by buffered oxide etch in one step.

4. The method of claim 1, wherein the step of removing the first and second material regions includes: removing the second material region by anisotropic reactive ion etch, and removing the first material region by HF vapor etch or by buffered oxide etch in one step.

5. The method of claim 1, wherein the step of removing the first and second material regions includes:
   depositing a protection layer;
   depositing a hard mask;
   patterning the protection layer and the hard mask; and
   etching the first and second material regions.

6. The method of claim 5, wherein the step of removing the first and second material regions further includes: depositing a mask after patterning the protection layer and the hard mask.

7. The method of claim 1, wherein the contact layer is made of a material including tungsten.

8. The method of claim 7, wherein the contact layer is formed by depositing a poly-silicon layer or a nitride layer, and next depositing tungsten.

9. The method of claim 1, wherein the via layer is made of a material including tungsten.

10. The method of claim 9, wherein the via layer is formed by depositing a poly-silicon layer or a nitride layer, and next depositing tungsten.

* * * * *